United States Patent [19]
Cosand

[11] Patent Number: 5,304,951
[45] Date of Patent: Apr. 19, 1994

[54] DIVIDER SYNCHRONIZATION CIRCUIT FOR PHASE-LOCKED LOOP FREQUENCY SYNTHESIZER

[75] Inventor: Albert E. Cosand, Agoura Hills, Calif.

[73] Assignee: Hughes Aircraft Company, Los Angeles, Calif.

[21] Appl. No.: 829,183

[22] Filed: Jan. 31, 1992

[51] Int. Cl.$^5$ .................................................. H03L 7/18
[52] U.S. Cl. .................................... 331/1 A; 331/14; 331/16; 331/25
[58] Field of Search ...................... 331/1 A, 14, 16, 25

[56] References Cited

U.S. PATENT DOCUMENTS 4,560,950 12/1985 Cabot .................................... 331/1 A
4,817,199 3/1989 Wallraff ............................... 331/55 X

FOREIGN PATENT DOCUMENTS 932049 2/1981 Fed. Rep. of Germany .
670020 4/1989 Switzerland .

*Primary Examiner*—Siegfried H. Grimm
*Attorney, Agent, or Firm*—Charles D. Brown; Randall M. Heald; Wanda K. Denson-Low

[57] ABSTRACT

A divider synchronization circuit (11) that provides faster settling to a new frequency in a phase-locked loop frequency synthesizer (10) that uses a programmable divider (16) and a phase detector (17). The circuit (11) is adapted to stop the divider (16) while its program is being changed, and then restart the divider (16) on command. The startup time of the divider (16) is automatically adjusted such that the divider output is in phase with a reference input to a phase detector (17). The outputs of the phase detector (17) are also blanked during the time period that the divider (16) is stopped. The circuit (11) reduces the time required for the phase locked-loop frequency synthesizer (10) to settle to its new frequency and phase when the frequency is changed. The timing of the divider startup eliminates the large phase transient that may occur when the divider startup timing is random, thus shortening the time that must be allowed for the synthesizer output to settle to its final phase. This circuit (11) is of particular value in a fast settling synthesizer design in which a VCO is pretuned to a close approximation to the new output frequency and then the loop is closed to drive the frequency to its exact value. The circuit (11) is well adapted for use in spread spectrum and frequency-agile radar systems, or spread spectrum communications systems.

7 Claims, 4 Drawing Sheets

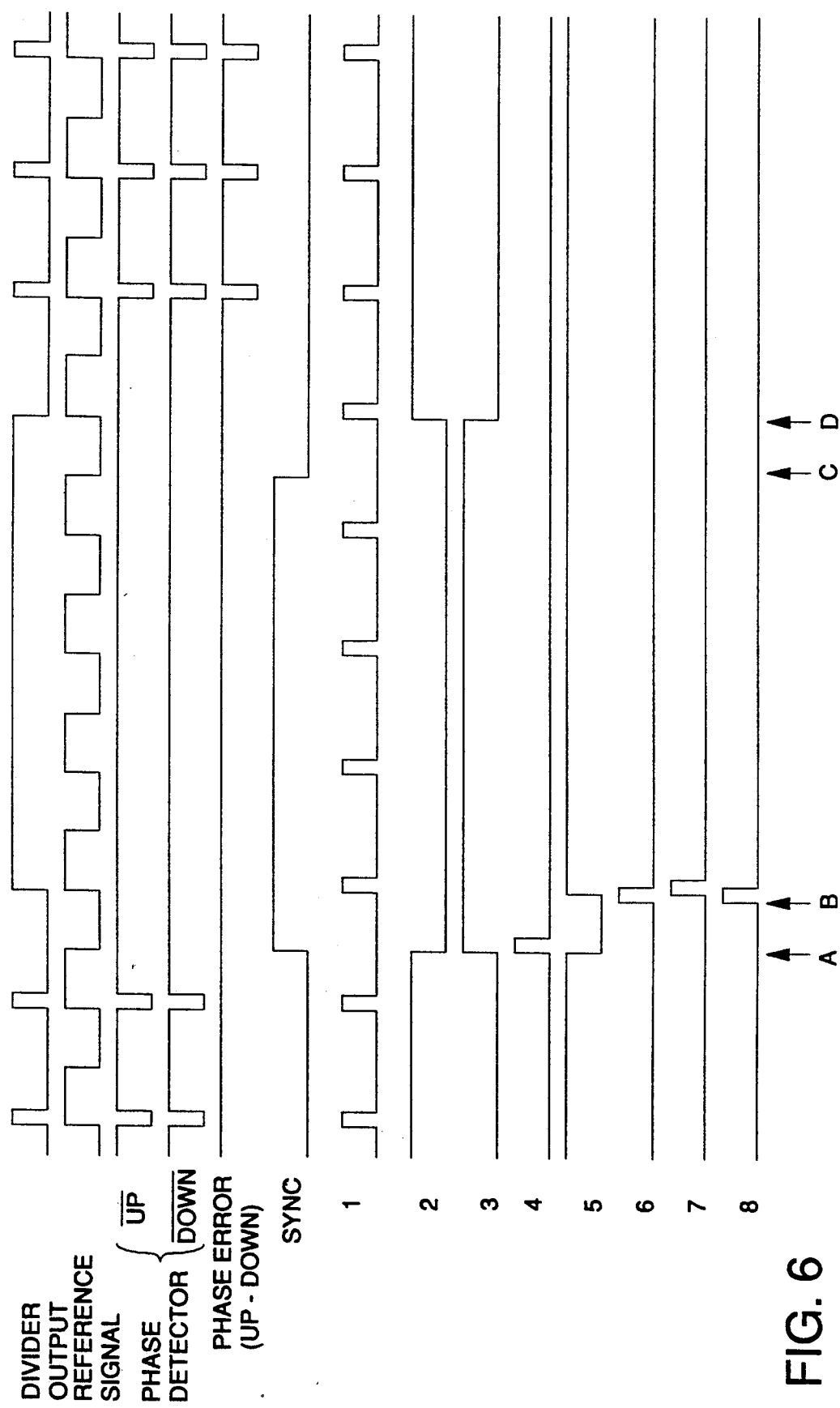

DIVIDER SYNCHRONIZATION CIRCUIT FOR PHASE-LOCKED LOOP FREQUENCY SYNTHESIZER

The U.S. government has certain rights in the invention described herein pursuant to U.S. Government Contract No. XF08635-86-C-0201.

BACKGROUND

The present invention relates generally to divider synchronization circuits, and more particularly, to a divider synchronization circuit that is adapted to synchronize the startup of a divider with the reference signal phase in a phase-locked loop.

Conventional programmable divider large scale integrated circuits having integrated phase detectors are commercially available, but none contains a means to synchronize divider startup, or to blank the phase detector output. There is a need to reduce the time required for a phase locked-loop frequency synthesizer to settle to its new frequency and phase when the frequency is changed. In conventional circuits a large phase transient may occur when the divider startup timing is random, and it may initially be as much as 180 degrees out of phase with the reference signal. Consequently, in conventional circuits, a relatively long time must be allowed for the synthesizer output to settle to its final phase. The inventor is not currently aware of any conventional circuit that synchronizes the startup of a divider with the reference signal phase in a phase-locked loop.

Accordingly it would be an improvement in the art to have a divider synchronization circuit that is adapted to synchronize the startup of a divider with the reference signal phase in a phase-locked loop.

SUMMARY OF THE INVENTION

The present invention comprises a divider synchronization circuit that provides faster settling to a new frequency in a phase-locked loop frequency synthesizer. This circuit is best implemented as part of a large scale integrated (LSI) circuit that contains a programmable divider and a phase detector for use in the phase-locked-loop frequency synthesizer. The circuit of the present invention is adapted to stop the divider while its program is being changed, and then, on command, restart the divider. Stopping the divider 16 is not absolutely necessary, but is a very convenient way to get it to the desired state from which it is to start. The startup time of the divider is automatically adjusted such that the divider output is in phase with a reference input to the phase detector. The phase detector outputs are also blanked during the time period that the divider is stopped.

The purpose of the present invention is to reduce the time required for the phase locked-loop frequency synthesizer to settle to its new frequency and phase when the frequency is changed. The timing of the divider startup eliminates the large phase transient that may occur when the divider startup timing is random, which timing may initially be as much as 180 degrees out of phase with the reference signal, thus shortening the time that must be allowed for the synthesizer output to settle to its final phase.

This circuit is of particular value in a fast settling synthesizer design in which a VCO is pretuned to a close approximation to the new output frequency and then the loop is closed to drive the frequency to its exact value. The present invention is well adapted for use in spread spectrum and frequency-agile radar systems, or spread spectrum communications systems, for example.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 6 shows timing diagrams of the circuit of FIG. 3.

DETAILED DESCRIPTION

Figure 1:
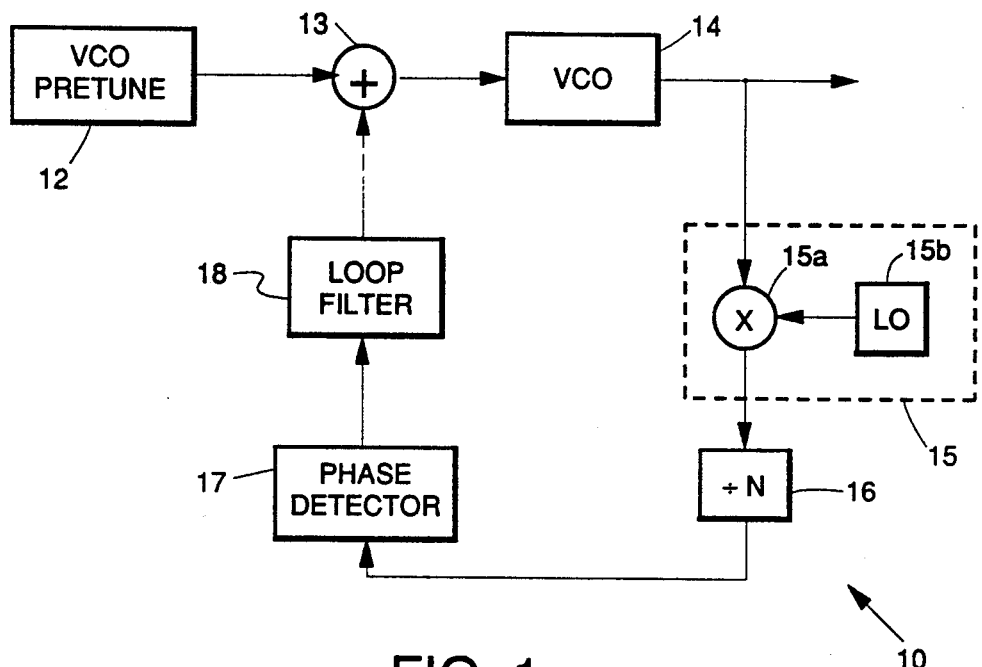
FIG. 1 shows a block diagram of a synthesizer that may be adapted to employ a divider synchronization circuit made in accordance with the principles of the present invention.

Referring to the drawing figures, FIG. 1 shows a block diagram of a synthesizer 10 that may employ a divider synchronization circuit 11 (FIGS. 3 and 4) in accordance with the principles of the present invention. The synthesizer 10 comprises a voltage controlled oscillator (VCO) pretune circuit 12 that has its output coupled to one input of a summing node 13 (or adder 13), whose output is coupled to a voltage controlled oscillator (VCO) 14. The output of the voltage controlled oscillator 14 is coupled through an optional frequency translator circuit 15 comprising a mixer 15a and a local oscillator 15b, whose output is coupled by way of a programmable divider 16 (divide-by-N circuit) to an input of a phase detector 17. A reference frequency signal is applied to a second input of the phase detector 17. The output of the phase detector 17 is coupled by way of a loop filter 18 to a second input of the adder 13 in order to close the phase locked loop of the synthesizer 10.

Figure 2:
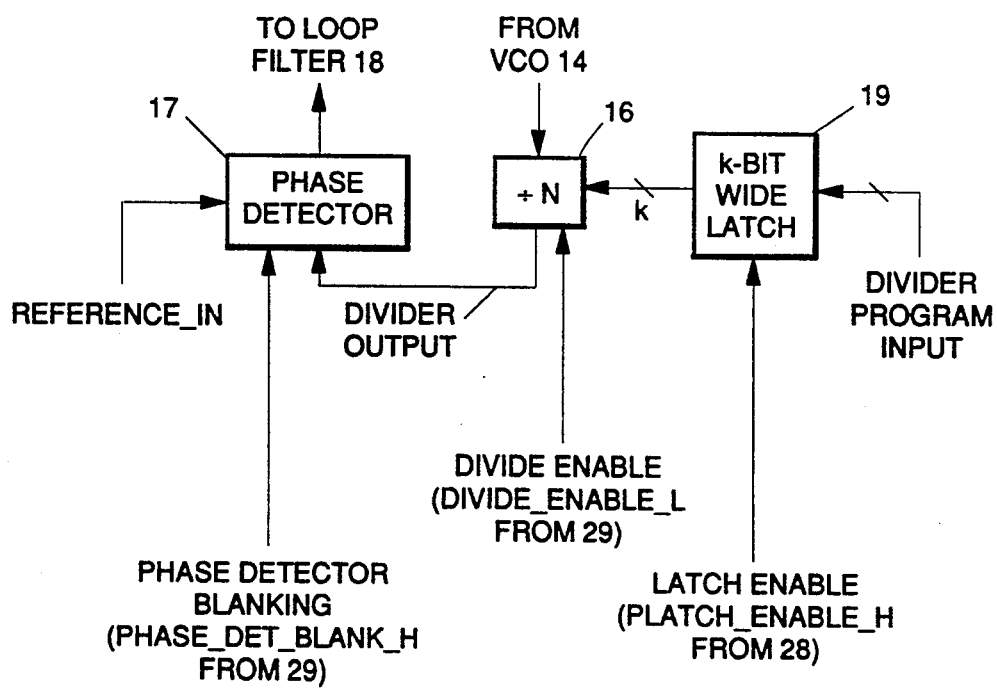
FIG. 2 shows a more detailed drawing of the divider and phase detector portion of the synthesizer of FIG. 1.
Figure 3:
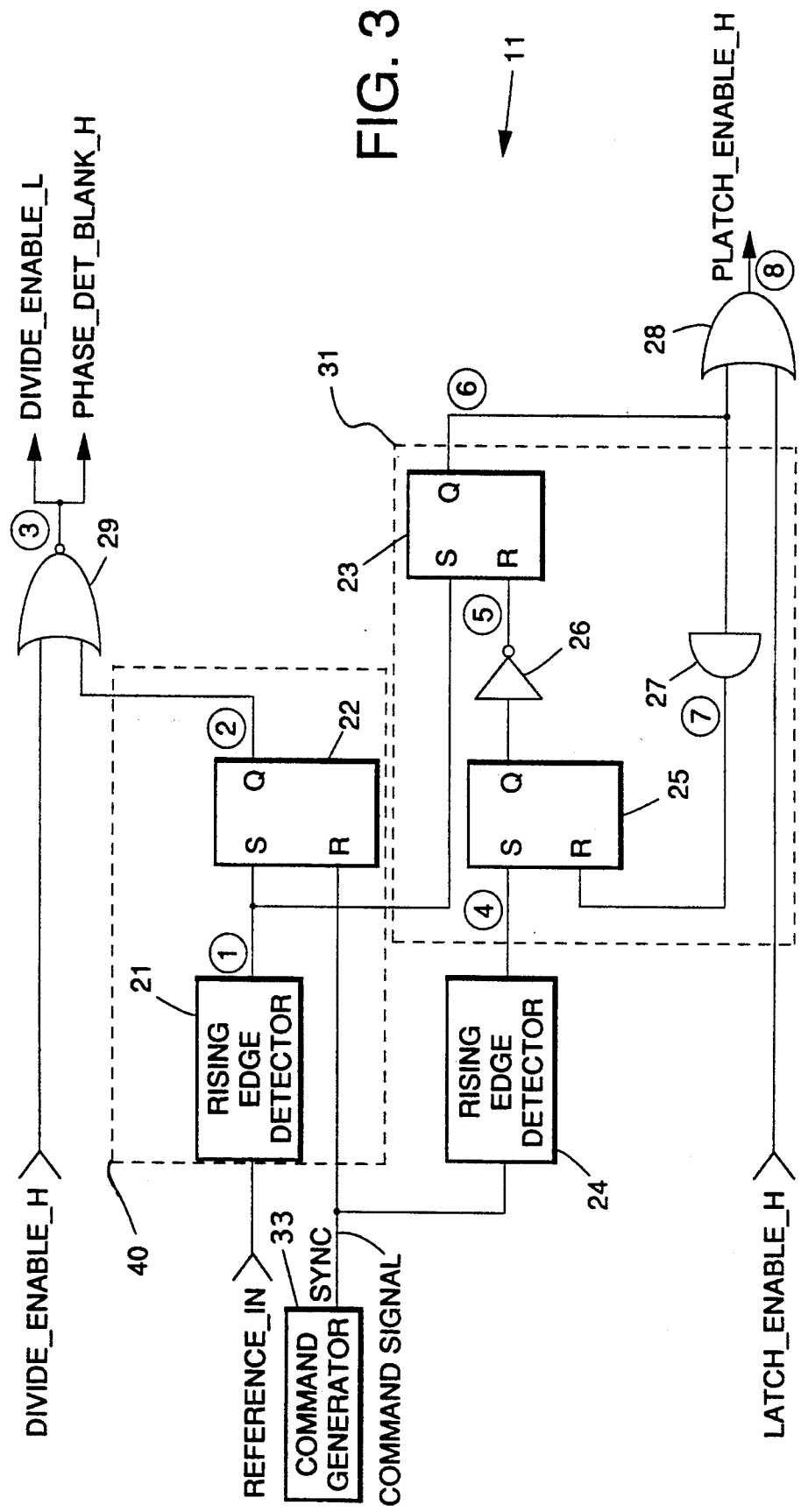
FIG. 3 shows a detailed block diagram of the divider synchronization circuit in accordance with the principles of the present invention that may be employed in the circuit of FIG. 1 and that interfaces to the circuit of FIG. 2.

FIG. 2 shows a more detailed drawing of the divider 16 and phase detector 17 of the synthesizer 10 of FIG. 1. The phase detector 17 is coupled between the divider 16 and the loop filter 18 and is adapted to receive the reference signal input and a phase detector blanking signal derived from the output of a gate 29 (FIG. 3). The divider 16 is adapted to receive signals from the VCO 14, a divide enable signal derived from the output of the gate 29 (FIG. 3), and k-bit wide programming input signals derived from an external computer (not shown), for example, that are stored in a k-bit wide divider program data latch 19 controlled by a latch enable signal.

The latch 19 holds the program data to determine the divide number N. The latch 19 allows for a new value of N to be entered into the divider 16 when the latch enable signal is strobed. The divide enable signal stops the divider 16, starts the divider 16 from a known state, preferably the start of its divide cycle, and permits new program data to be loaded that determines a new value for N while the divider 16 is stopped. The phase detector blanking signal stops the output of the phase detector 17 so that it will not indicate that there is either a phase or a frequency error even if there is no signal on one of its two inputs (reference or from the divider 16). This keeps the phase detector 17 from driving the loop filter 18 when the divider 16 is not enabled.

FIG. 3 shows a detailed block diagram of the divider synchronization circuit 11 in accordance with the principles of the present invention that may be employed in the synthesizer 10 of FIG. 1. The divider synchronization circuit 11 comprises a first rising edge detector 21 that is adapted to selectively receive the reference signal (REFERENCE_IN) and whose output is coupled to respective S inputs of first and third latches 22, 23. For synchronization of the divider 16 to the reference, only the reference signal is supplied to the first rising edge detector 21. Alternatively, this circuitry may be used to synchronize loading of a new program number into the divider 16 without generating any problems in the output of the divider 16. In this case, the input to the first rising edge detector 21 is the output of the divider 16. A SYNC signal is provided by a command signal circuit 33 that is adapted to cause a frequency change to occur in the synthesizer 10. The SYNC signal (or command signal) is applied to the R input of the first latch 22 and to an input of a second rising edge detector 24. The Q output of the first latch is coupled to an input of a NOR gate 29, and an externally supplied divider enable signal (DIVIDE_ENABLE_H) is coupled to the second input thereof. The output of the NOR gate 29 provides a divide enable signal (DIVIDE_ENABLE_L) and a detector blanking signal (PHASE_DETECTOR_BLANK_H) at its output.

An output of the second rising edge detector 24 is coupled to the S input of a second latch 25 whose Q output is coupled through an inverter 26 to the R input of the third latch 23. The Q output of the third latch 23 is fed back through a delay element 27 to the R input of the second latch 25 and is also coupled to an input of an OR gate 28. An externally supplied latch enable signal (LATCH_ENABLE_H) is coupled to the second input of the OR gate 28, which provides a program latch enable signal (PLATCH_ENABLE_H) at its output.

Operationally, the divider synchronization circuit 11 of the present invention provides for faster settling to a new frequency in the phase-locked loop frequency synthesizer 10. The synthesizer 10 contains the programmable divider 16 and the phase detector 17. The divider synchronization circuit 11 stops the divider 16 while its program is being changed, and then, on command, restarts the divider 16. The startup time of the divider 16 is automatically adjusted such that the output of the divider 16 is in phase with a reference signal input to the phase detector 17. The outputs of the phase detector 17 are also blanked during the time that the divider 16 is stopped.

The divider synchronization circuit 11 reduces the time required for a phase locked-loop frequency synthesizer 10 to settle to its new frequency and phase when the frequency is changed. The startup timing of the divider 16 eliminates the large phase transient that may occur when the startup timing is random, thus shortening the time that must be allowed for the output of the synthesizer 10 to settle to its final phase. The divider synchronization circuit 11 is of great value in a fast settling synthesizer design in which a VCO is pretuned to a close approximation to the new output frequency and then the loop is closed to drive the frequency to its exact value, as is shown in the circuit of FIG. 1.

The divider synchronization circuit 11 shown in FIG. 3 is most preferably contained in the control and synchronization section of a large scale integrated (LSI) circuit containing the divider 16 and phase detector 17. The synchronization circuit 11 is contained within a programmable divider and phase detection LSI circuit designed for use in a frequency reference unit in an AMRAAM missile system, but it is not presently used, since the present AMRAAM missile system does not require very fast changes in frequency. The divider synchronization circuit 11 shown in FIG. 2 is used to start the programmable divider 16 in phase with the phase detector reference frequency signal, and also control the loading of program data into latches at the program input of the divider 16.

If use of the divider synchronization circuit 11 is not desired in a particular application, for example when very fast settling after a frequency change is not required, it may be overridden by pulling high the external DIVIDE_ENABLE_H, LATCH_ENABLE_H, and SYNC signal inputs so that the divider 16 runs continuously, and thus the program data latch 19 is made transparent to the program data.

It is assumed that the circuitry of FIG. 3 is used with a divider 16 having an active low enable that starts the divider 16 at or near the beginning of its counting cycle, that the divider 16 has program data latches that load data when an enable signal is pulled high, and that the divider 16 is used with a sequential phase detector 17 which is triggered by the end-of-count signal from the divider 16, and which includes an active high blanking control. The operation of the particular divider 16 used in the divider synchronization circuit 11 is such that the length of the next divider cycle is determined by the data present in the program latches at the time of the output pulse. If the divide enable signal is pulled high after the divider 16 has begun a cycle, the divider 16 completes the cycle and then stops in the middle of the output pulse, at the appropriate time for the program to be changed.

An automatic synchronization mode of operation requires that the external active-high divide enable and latch enable control lines be held low, so that these functions will be controlled by internally generated signals. During normal divider 16 and phase detector 17 operation, the SYNC signal is held low. New program data for the divider 16 may then be presented at the program latch inputs without affecting the continuing divider operation. The divider synchronization circuit 11 is based on the assumption that the divider 16 is running in a phase-locked loop so that the divider output and the rising edge of the reference frequency input signal occur at nearly the same time. A new program is entered and the divider 16 is restarted in synchronization with the reference frequency signal by pulling the SYNC input high, holding it high as long as is required (SYNC should be held high through at least one rising edge of the reference input).

The detailed operation of the divider synchronization circuit 11 is as follows. When SYNC is pulled high, it resets the first latch 22 and, through the NOR gate 29, the phase detector 17 is blanked and the internal DIVIDE_ENABLE_L signal is pulled high so the divider 16 stops at the end of its present divide cycle. The rising edge SYNC causes the second rising edge detector 24 to enable a one-shot 31 comprising the second latch 25, the inverter 26, the third latch 23 and the delay 27. The one-shot 31 is then triggered by a pulse from the first rising edge detector 21 after the next rising edge of the reference frequency signal input (at which time the divider 16 should have reached the end of a divide cycle and stopped); the pulse from the one shot 31 strobes the program data latches (through the OR gate 28) so that the new program is loaded. When the SYNC signal is pulled low, the next rising edge of REFERENCE_IN causes the first rising edge detector 21 to generate a pulse that restarts the divider 16 and phase detector 17.

Figure 4:
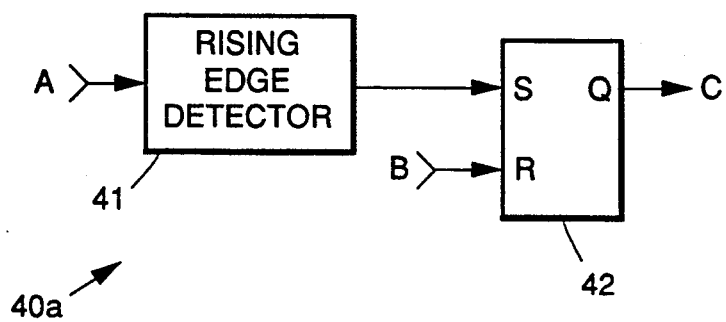
FIG. 4 shows a first alternative embodiment of a part of the circuit of FIG. 3.
Figure 5:
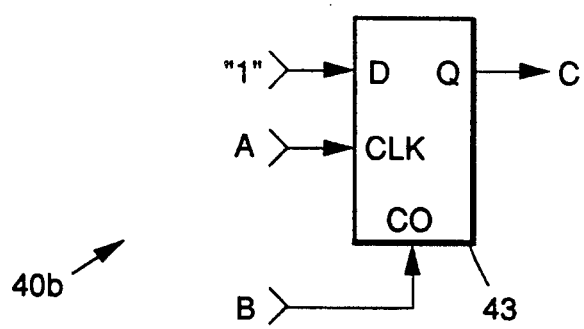
FIG. 5 shows a second alternative embodiment of a part of the circuit of FIG. 3.

FIGS. 4 and 5 show alternative arrangements 40a, 40b of a portion 40 of the circuit of FIG. 3. In FIG. 4, the first alternative arrangement 40a comprises a rising edge detector 41 having an A input, whose output is coupled to the S input of an RS latch 42. The R input of the RS latch 42 is coupled to a B input. The output of the RS latch 42 is taken from its Q output. The function of the rising edge detector 21, 24 followed by an RS latch 22, 25 may also be performed by a resettable edge-triggered flip flop arrangement 40b such as is shown in FIG. 5. FIG. 5 shows a second alternative arrangement 40b of the portion 40 of the circuit of FIG. 3. In this embodiment, the resettable edge-triggered flip flop arrangement 40b comprises a resettable edge-triggered D-type flip flop 43 having high signal or "1" coupled to its D input and an A input coupled to the clock input, a B input coupled to its CO input and its output is taken from its Q output. With reference to FIG. 3, the reference signal (REFERENCE_IN or DIVIDER_OUT_X) comprises the A input to either of these alternative circuits, while the SYNC signal comprises the B input of these alternative circuits, and the output Q (identified as the C output) is coupled to an input of the NOR gate 29 or an input of the OR gate 28.

FIG. 6 shows timing diagrams of a composite of the circuit of FIGS. 2 and 3. Shown in FIG. 6 from the top of the drawing are the divider output signal, reference signal, phase detector up/down signals, phase error signal, SYNC signal, and the signals located at various places within the circuit as will be described below. Signal number 1 is taken at the output of the first rising edge detector 21. Signal number 2 is taken at the output of the first latch 22. Signal number 3 is taken at the output of the first gate 29. Signal number 4 is taken at the output of the second rising edge detector 24. Signal number 5 is taken at the reset input (R) of the third latch 23. Signal number 6 is taken at the output of the third latch 23. Signal number 7 is taken at the output of the fourth gate 27. Signal number 8 is taken at the output of the second gate 28. The signals 1–8 are also shown in FIG. 3 for reference.

The external DIVIDE_ENABLE_H and LATCH_ENABLE_H signals are held low. The divider output is connected to the phase detector input. The reference signal is supplied to synchronization circuitry as well as to the phase detector 17. Significant events that are shown in FIG. 6 are the following. At the time marked "A", the SYNC signal is pulled high, and the first latch 22 is reset, so signal 3, DIVIDE_ENABLE_L and PHASE_DET_BLANK_H goes high. The rising edge of the SYNC signal also causes the second rising edge detector 24 to generate a pulse (signal 4) to set the second latch 25, so the reset input (signal number 5) to the third latch 23 goes low. At the time marked "B", the divider 16 reaches its end of count and stops, since the signal DIVIDE_ENABLE_L is high. The pulse (signal number 1) from the reference edge now sets the third latch 23; its output (signal number 6) drives gate 28 so that the output of the second gate 28 produces a signal (signal number 8) to load new program data for the divider 16, and signal 6 also propagates through delay element 27 to generate signal 7 to reset the second latch 25. After a suitable length of time to pretune the voltage controlled oscillator (VCO) 14 so it is close to the new frequency, SYNC is pulled low at time "C". At time "D", the first reference signal edge after the time marked "C" sets the first latch 22, restarting the divider 16 nearly in sync with the reference signal.

During "normal" operation, DIVIDER_ENABLE_H, LATCH_ENABLE_H and SYNC are high. There are three synchronization modes, as follows. A sufficient number of clock pulses must be provided to count down the dividers to zero with DIVIDER_ENABLE_H low before a synchronous startup is guaranteed.

Sync mode 1. Synchronize to external reference, with phase detector blanking. DIVIDER_ENABLE_H, LATCH_ENABLE_H are low. Set new program data (with SYNC low). Pull SYNC high: divider 16 stops, phase detector 17 stops; strobe loads data on the next rising reference signal edge. Pull SYNC low: divider 16 and phase detector 17 are enabled on the next rising reference signal edge.

Sync mode 2. Change the divider program without a problem. Generate pulse to strobe data into latches 22, 23, 25. The pulse may be timed by either the negative DIVIDER_OUT or positive REFERENCE_IN transition. DIVIDER_ENABLE_H is high, LATCH_ENABLE_H is low. Set new program data (with SYNC low). Pull SYNC high: next out falling edge of the divider 16 out will strobe data into the latch 19. If a code is loaded such that the divider 16 does not produce any output pulses, LATCH_ENABLE_H must be pulled high to load a good code into the latch 19.

Sync mode 3. Start the divider 16 (or several dividers simultaneously) at a specified time. LATCH_ENABLE_H is low, SYNC is high. Start with the signal DIVIDER_ENABLE_H low (the divider 16 and phase detector 17 are disabled). Set program data. Strobe LATCH_ENABLE_H to load the data. Pull the signal DIVIDER_ENABLE_H high: the divider 16 starts from a known state.

The following inputs, signal levels and functions apply to the circuit of FIG. 3.

| Inputs | Signal levels | Function |
| --- | --- | --- |
| LATCH_ENABLE | TTL | High: Latch outputs follow the inputs. Low: Latch holds whatever data is present at the time of the high to low transition. |
| SYNC | TTL | 1) DIVIDE_OUT_EN low, so output is from phase |

| Inputs | Signal levels | Function |
|---|---|---|
| | | detector: While SYNC is low the phase detector output is forced to zero and the divider is stopped. When sync goes high the phase detector and divider are enabled by the next positive edge on the reference input.<br>2) DIVIDE_OUT_EN high, so output is from divider: A LATCH_ENABLE pulse is generated internally by the falling edge of the first divider output pulse following a falling edge of SYNC. |

Thus there has been described a new and improved divider synchronization circuit that is adapted to synchronize the startup of a divider with the reference signal phase in a phase-locked loop. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A divider synchronization circuit for use with a phase-locked loop frequency synthesizer (10) comprising a programmable divider (16) and a phase detector (17), said divider synchronization circuit comprising:

detection means (21, 22, 23, 24, 25) for receiving a reference frequency signal input, and a synchronizing signal that comprises a command signal that causes a frequency change to occur, for detecting a time at which the reference frequency signal makes a transition that is used as a phase reference against which the output of the programmable divider (16) is compared;

a first gate (28) having first and second inputs and an output, and having its first input coupled to a first output of the detection means (21, 22, 23, 24, 25) and its second input adapted to receive a latch enable signal, and having its output adapted to provide a latch enable signal for use by the programmable divider that is adapted to latch its programming inputs while the startup time of the divider (16) is adjusted so that its output is in phase with the reference frequency signal input to the phase detector (17); and a second gate (29) having first and second inputs and an output, and having its first input coupled to a second output of the detection means (21, 22, 23, 24, 25) and its second input adapted to receive a divide enable signal, and having its output adapted to provide divide enable and phase detector blanking signals for use by the programmable divider (16) and phase detector (17), respectively, that is adapted to reset the divider (16) and blank the phase detector (17);

and whereby the divide enable signal is adapted to cause the interruption of the divider (16) while its program is being changed and then restart the divider (16), and wherein the outputs of the phase detector (17) are blanked using the phase detector (17) blanking signal during the time that the divider (16) is interrupted, and whereby the startup time of the divider (16) is adjusted so that the output of the divider (16) is substantially in phase with the reference frequency signal input to the phase detector (17).

2. The divider synchronization circuit of claim 1 wherein the detection means (21, 22, 23, 24, 25) comprises:

a first rising edge detector (21) having an input and an output, that is adapted to receive a reference frequency signal;

a first latch (22) having a plurality of inputs and an output that comprises the second output of the detection means, and having a first input coupled to the output of the first rising edge detector (21) and having a second input coupled to receive the synchronizing signal that is adapted to cause a frequency change to occur;

a second rising edge detector (24) having an input and an output, that is adapted to receive the synchronizing signal; and a one-shot circuit (31) coupled to the outputs of the first and second rising edge detectors (21, 22) that is adapted to receive a divide enable signal and provide an enabling output signal from the first output of the detection means.

3. The divider synchronization circuit of claim 1 wherein the detection means (21, 22, 23, 24, 25) comprises:

a resettable edge-triggered flip flop (40b) having a plurality of inputs and an output, and having a high signal coupled to a first input, a synchronizing input coupled to a second input, a reference frequency signal coupled to a clock input, and an output taken from its Q output.

4. The divider synchronization circuit of claim 2 wherein the one-shot circuit (31) comprises:

a second latch (25) having S and R inputs and a Q output, and having its S input coupled to the output of the second rising edge detector (24);

an inverter (26) having an input coupled to the Q output of the second latch (25);

a third latch (23) having S and R inputs and a Q output, and having its S input coupled to the output of the first rising edge detector (21) and having its R input coupled to the output of the inverter (26); and a delay circuit (27) having an input coupled to the Q output of the third latch (23) and having its output coupled to the R input of the second latch (25).

5. A divider synchronization circuit for use with a phase-locked loop frequency synthesizer (10) comprising a programmable divider (16) and a phase detector (17), said divider synchronization circuit comprising:

detection means (21, 22, 23, 24, 25) for receiving a reference frequency signal input, and a synchronizing signal that comprises a command signal that causes a frequency change to occur, for detecting a time at which the reference frequency signal makes a transition that is used as a phase reference against which the output of the programmable divider (16)

is compared, and wherein the detection means (21, 22, 23, 24, 25) comprises:
- a first rising edge detector (21) having an input and an output, that is adapted to receive a reference frequency signal;
- a first latch (22) having a plurality of inputs and an output that comprises the second output of the detection means, and having a first input coupled to the output of the first rising edge detector (21) and having a second input coupled to receive the synchronizing signal that is adapted to cause a frequency change to occur;
- a second rising edge detector (24) having an input and an output, that is adapted to receive the synchronizing signal; and
- a one-shot circuit (31) coupled to the outputs of the first and second rising edge detectors (21, 22) for providing an enabling output signal from the first output of the detection means;

a first gate (28) having first and second inputs and an output, and having its first input coupled to a first output of the detection means (21, 22, 23, 24, 25) and its second input adapted to receive a latch enable signal, and having its output adapted to provide a latch enable signal for use by the programmable divider that is adapted to latch its programming inputs while the startup time of the divider (16) is adjusted so that its output is in phase with the reference frequency signal input to the phase detector (17); and a second gate (29) having first and second inputs and an output, and having its first input coupled to a second output of the detection means (21, 22, 23, 24, 25) and its second input adapted to receive a divide enable signal, and having its output adapted to provide divide enable and phase detector blanking signals for use by the programmable divider (16) and phase detector (17), respectively, that is adapted to reset the divider (16) and blank the phase detector (17);

and whereby the divide enable signal is adapted to cause the interruption of the divider (16) while its program is being changed and then restart the divider (16), and wherein the outputs of the phase detector (17) are blanked using the phase detector (17) blanking signal during the time that the divider (16) is interrupted, and whereby the startup time of the divider (16) is adjusted so that the output of the divider (16) is substantially in phase with the reference frequency signal input to the phase detector (17).

6. The divider synchronization circuit of claim 5 wherein the detection means (21, 22, 23, 24, 25) comprises:
- a resettable edge-triggered flip flop (40b) having a plurality of inputs and an output, and having a high signal coupled to a first input, a synchronizing input coupled to a second input, a reference frequency signal coupled to a clock input, and an output taken from its Q output.

7. The divider synchronization circuit of claim 6 wherein the one-shot circuit (31) comprises:
- a second latch (25) having S and R inputs and a Q output, and having its S input coupled to the output of the second rising edge detector (24);
- an inverter (26) having an input coupled to the Q output of the second latch (25);
- a third latch (23) having S and R inputs and a Q output, and having its S input coupled to the output of the first rising edge detector (21) and having its R input coupled to the output of the inverter (26); and
- a delay circuit (27) having an input coupled to the Q output of the third latch (23) and having its output coupled to the R input of the second latch (25).

* * * * *